US010219365B1

(12) United States Patent
Chen et al.

(10) Patent No.: US 10,219,365 B1
(45) Date of Patent: Feb. 26, 2019

(54) BIDIRECTIONAL AND UNIFORM COOLING FOR MULTIPLE COMPONENTS IN A COMPUTING DEVICE

(71) Applicant: QUANTA COMPUTER INC., Taoyuan (TW)

(72) Inventors: Chao-Jung Chen, Taoyuan (TW); Yi-Chieh Chen, Taoyuan (TW); Ming-Hung Tsai, Taoyuan (TW); Jen-Mao Chen, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 15/903,465

(22) Filed: Feb. 23, 2018

(51) Int. Cl.
*H05K 7/20* (2006.01)
*H05K 1/02* (2006.01)
*G06F 1/20* (2006.01)
*H01L 23/367* (2006.01)

(52) U.S. Cl.
CPC .............. *H05K 1/021* (2013.01); *G06F 1/20* (2013.01); *H01L 23/367* (2013.01)

(58) Field of Classification Search
CPC .......... H05K 1/021; G06F 1/20; H01L 23/367
USPC ......................................................... 361/720
See application file for complete search history.

(56) References Cited

U.S. PATENT DOCUMENTS

| | | | | |
|---|---|---|---|---|
| 5,946,190 A * | 8/1999 | Patel | .................. | H05K 7/20154 165/104.21 |
| 6,554,060 B2 * | 4/2003 | Noda | ........................ | F28F 3/02 165/185 |
| 6,690,575 B1 * | 2/2004 | Banton | .............. | H05K 7/20727 165/122 |
| 6,698,500 B2 * | 3/2004 | Noda | ........................ | F28F 3/02 165/80.3 |
| 6,698,511 B2 * | 3/2004 | DiBene, II | .......... | H01L 23/3672 165/185 |

(Continued)

FOREIGN PATENT DOCUMENTS

| CN | 101641002 B | 10/2012 |
|---|---|---|
| CN | 203325998 U | 12/2013 |

(Continued)

OTHER PUBLICATIONS

Taiwanese Search Report for Application No. 107119039, dated Oct. 15, 2018, w/ First Office Action.

*Primary Examiner* — Anatoly Vortman
(74) *Attorney, Agent, or Firm* — Nixon Peabody LLP; Eduardo J. Quiñones; Zhou Lu (57) ABSTRACT

A circuit card assembly includes a circuit card, a plurality of components disposed on a first surface of the circuit card in a shadow arrangement, and a plurality of air-cooled heat sink structures disposed on each of the components. Each of the plurality of heat sink structures comprises a plurality of impedance zones arranged in series substantially perpendicular to the airflow path, where the plurality of impedance zones comprise a first impedance zone having a first air impedance, and a second impedance zone having a second air impedance less than the first air impedance. Further, the plurality of zones in the plurality of heat sink structures are aligned so that the first impedance zone in one of the plurality of heat sink structures does not overlap with the first impedance zone in another of the plurality of heat sink structures, relative to the airflow path.

14 Claims, 5 Drawing Sheets

(56) References Cited

U.S. PATENT DOCUMENTS

| | | | | |
|---|---|---|---|---|
| 6,845,812 | B2* | 1/2005 | Turocy | F28F 3/04 |
| | | | | 165/185 |
| 6,888,725 | B2* | 5/2005 | Kubo | G06F 1/20 |
| | | | | 257/721 |
| 7,274,571 | B2* | 9/2007 | Wei | H05K 7/1461 |
| | | | | 165/104.26 |
| 7,518,862 | B1* | 4/2009 | Macika | G06F 1/20 |
| | | | | 361/688 |
| 2003/0155106 | A1* | 8/2003 | Malone | F28F 3/02 |
| | | | | 165/121 |
| 2007/0230118 | A1* | 10/2007 | Leija | H05K 7/20718 |
| | | | | 361/690 |
| 2007/0261242 | A1* | 11/2007 | Xia | B23P 15/26 |
| | | | | 29/890.03 |
| 2015/0153113 | A1* | 6/2015 | Glover | H01L 23/467 |
| | | | | 361/692 |

FOREIGN PATENT DOCUMENTS

| | | |
|---|---|---|
| CN | 204681732 U | 9/2015 |
| CN | 103957682 B | 11/2016 |
| CN | 206441100 U | 8/2017 |

* cited by examiner

BIDIRECTIONAL AND UNIFORM COOLING FOR MULTIPLE COMPONENTS IN A COMPUTING DEVICE

FIELD OF THE INVENTION

The present invention relates to the cooling of computer system components, and more specifically to systems and methods for bidirectional and uniform cooling of multiple components in a computing device.

BACKGROUND

In the field of electronics, including computing devices, the typical trend has been to reduce the size of components while providing the same or improved performance. This means, in most cases, an increase in device density. However, when device density is increased, this invariably least to a higher power density. In turn, higher power densities lead to increased heat dissipation and temperature control issues. In some cases, temperature control issues can be acute. For example, in computing devices with high power chipsets in a so-called "shadow" arrangement (where the components are arranged in series with respect to airflow), such issues can lead to overheating problems. Specifically, a first upstream component (with respect to airflow) may be properly cooled, but a subsequent downstream component (with respect to airflow) may not be properly cooled. The reason is because once air is heated by the first component, the air has limited capacity to absorb heat from the second component.

Traditionally, this problem has been addressed by the use of different upstream and downstream heat sinks to balance airflow impedance. In particular, an upstream heat sink with low airflow impedance is used in order to allow more air to reach the downstream heat sink. In this way, the air reaching the downstream heat sink may have an elevated temperature, but still have sufficient capacity to absorb additional heat. Additionally, the downstream heat sink can be configured with a higher airflow impedance to cause the air to linger longer and absorb more heat. However, such configurations are a compromise, resulting in increased cooling efficiency for the downstream component at the cost of cooling efficiency for the upstream component. Moreover, such configurations are unidirectional. As a result, computing devices implementing such a scheme have to be mated with a compatible ventilation system to ensure airflow in the correct direction.

SUMMARY

Embodiments of the invention concern systems and methods for bidirectional and uniform cooling of multiple components in a computing device.

A circuit card assembly according to a first embodiment includes a circuit card and a plurality of components disposed on a first surface of the circuit card, where the plurality of components arranged in a path substantially perpendicular to an airflow path along the first surface of the circuit card. The circuit card also includes plurality of air-cooled heat sink structures, each disposed on one of the plurality of components. In the circuit card assembly, each of the plurality of heat sink structures comprises a plurality of impedance zones arranged in a series substantially perpendicular to the airflow path. The plurality of impedance zones comprise a first impedance zone having a first air impedance, and a second impedance zone having a second air impedance less than the first air impedance. Further, the plurality of zones in the plurality of heat sink structures are aligned so that the first impedance zone in one of the plurality of heat sink structures does not overlap with the first impedance zone in another of the plurality of heat sink structures, relative to the airflow path.

In the circuit card assembly, each of the plurality of heat sink structures can include a plurality of fins. Further, a spacing of a portion of the plurality of fins in the first impedance zone can be less than a spacing of a portion of the plurality of fins in the second impedance zone.

In the circuit card assembly, the plurality of zones in the plurality of heat sink structures can be aligned so that airflow through the first impedance zone in each one of the plurality of heat sink structures is substantially equal in a first direction along the airflow path. Further, the plurality of zones in the plurality of heat sink structures can be aligned so that airflow through the first impedance zone in each one of the plurality of heat sink structures in a second direction opposite the first direction, is substantially equal to the airflow in the first direction.

In the circuit card assembly, the plurality of heat sink structures can have substantially a same width in a direction perpendicular to the airflow path. Further, the plurality of heat sink structures can substantially overlap each other relative to the airflow path.

An add-on processing unit includes a circuit card and a first processor and a second processor disposed in series on a first surface of the circuit card along an airflow path. The processing unit also includes a first heat sink structure disposed on the first processor and a second heat sink structure disposed on the second processor. In the processing unit, the first heat sink structure and the second heat sink structure includes at least a first impedance zone and a second impedance zone arranged in a series substantially perpendicular to the airflow path. Further, the first impedance zone has a first air impedance, and the second impedance zone has a second air impedance less than the first air impedance. Additionally, the first impedance zone in the first heat sink structure does not overlap with the first impedance zone in the second heat sink structure, relative to the airflow path.

In the processing unit, each of the first heat sink structure and the second heat sink structure can include plurality of fins. Further, a spacing of a portion of the plurality of fins in the first impedance zone can be less than a spacing of a portion of the plurality of fins in the second impedance zone.

In the processing unit, airflow through the first impedance zone in each one of the plurality of heat sink structures can be substantially equal in a first direction along the airflow path. Further, the plurality of zones in the first and second heat sink structures are aligned so that airflow through the first impedance zone in each one of heat sink structures in a second direction opposite the first direction, is substantially equal to the airflow in the first direction.

In the processing unit, the first heat sink structure and the second heat sink structure can have substantially the same width in a direction perpendicular to the airflow path.

Additionally, the first heat sink structure and the second heat sink structure substantially overlap each other relative to the airflow path.

DETAILED DESCRIPTION

The present invention is described with reference to the attached figures, wherein like reference numerals are used throughout the figures to designate similar or equivalent elements. The figures are not drawn to scale, and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

As noted above, there are several issues with conventional cooling techniques for computing devices with high power chipsets in the shadow arrangement. The various embodiments alleviate such issues by providing a new heat sink architecture for use with multiple components in a shadow arrangement. Such an architecture provides improved cooling relative to traditional heat sink arrangements, while still allowing for airflow in multiple directions. The architecture of the various embodiments is described below with respect to FIG. 1.

Figure 1:
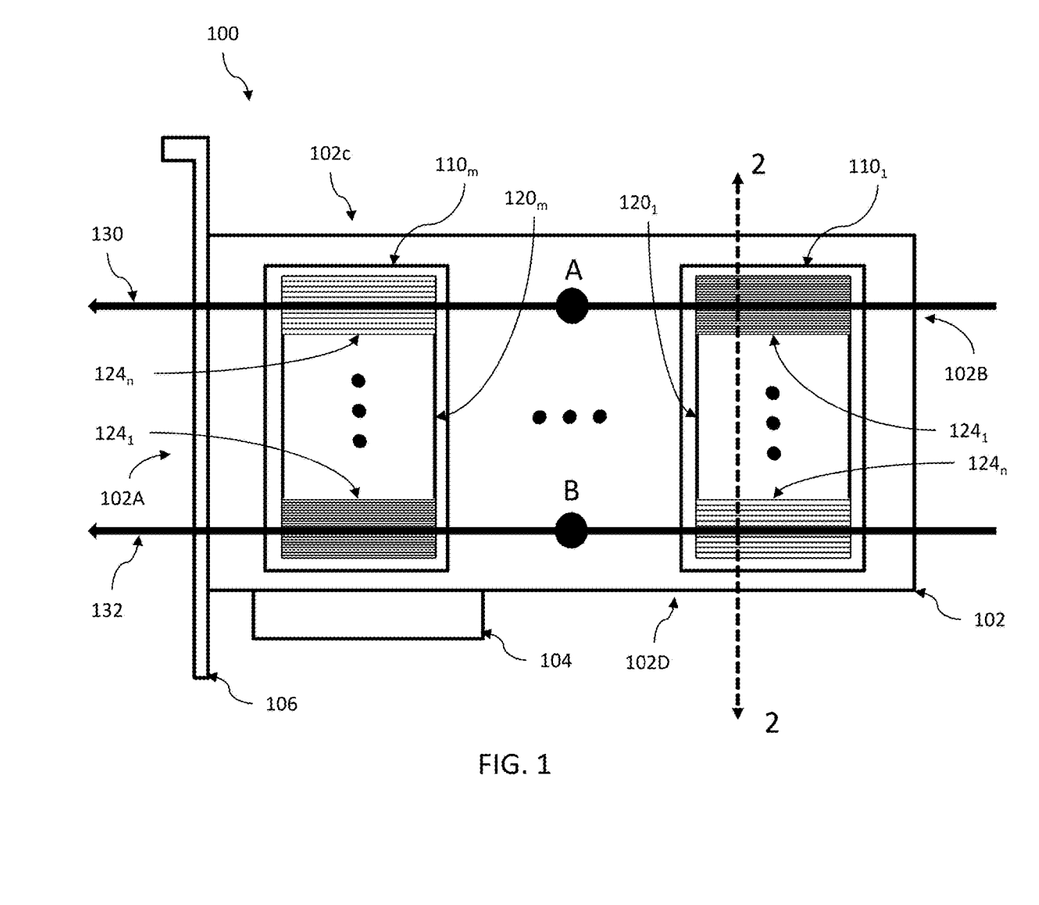
FIG. 1 is a schematic of a circuit card assembly configured to use a heat sink architecture in accordance with the various embodiments.

FIG. 1 is a schematic of a circuit card assembly 100 configured to use heat sink architecture in accordance with the various embodiments. As shown in FIG. 1, the circuit card assembly 100 includes a substantially planar circuit card 102 with a front end 102A, a back end 102B, a first longitudinal edge 102C and a second longitudinal edge 102D. In the circuit card assembly 100, the longitudinal edges 102C and 102D are substantially parallel to each other. The circuit card 102 can also include at least one bus connector 104 extending from one of longitudinal edges 102C and 102D. In the exemplary configuration of FIG. 1, a bus connector 104 extends from longitudinal edge 102D and substantially parallel to the plane of circuit card 102. The circuit card assembly 100 can also include a bracket structure 106 attached to the circuit card 102.

The bus connector 104 in FIG. 1 is illustrated as a Peripheral Component Interconnect Express (PCIe) bus, but the various embodiments are not limited in this regard. Rather any other computer bus can be used in the various embodiments without limitation.

The circuit card 102 can be, for example, a printed circuit board (PCB) manufactured according to any known processes. However, the various embodiments are not limited in this regard. Rather, any other technologies for forming a substrate or other substantially planar structure for mechanically supporting and electrically connecting various electronic components can be used in place of a PCB.

In some embodiments, the various embodiments will be illustrated with respect to an add-on unit. However, the various embodiments are not limited in this regard. Rather, the techniques discussed herein can be used with any other type of circuit card assembly, including motherboards or any other type of circuit board for use in a computing device.

As shown in FIG. 1, the circuit card 102 is configured to support two or more processors $110_i$ (where i=1 ... m and where m≥2). These can be graphics processing units (GPUs) or any other type of unit. In addition, the circuit card assembly 100 can include additional components (not shown), such as switch elements, memory elements, input/output (I/O) connectors, and other controller elements. However, a computing device in accordance with the various embodiments is not limited to the components listed above and may include more or less components than shown in FIG. 1.

In addition to the components discussed above, the circuit card assembly 100 includes a plurality of heat sink structures $120_i$ (where i=1 ... m and where m≥2). Each of the heat sink structures $120_i$ is associated with one of the processors $110_i$. In the various embodiments, each of the heat sink structures $120_i$ consists of a passive, air-cooled heat sink. For example, each heat sink structure $120_i$ can include, as in a traditional heat sink design, a number of fins, rods, or any other type of cooling members extending from a base (not shown in FIG. 1). In operation, such cooling members are arranged so that air can pass between the cooling members, allowing the air to absorb heat from the cooling members.

Figure 2:
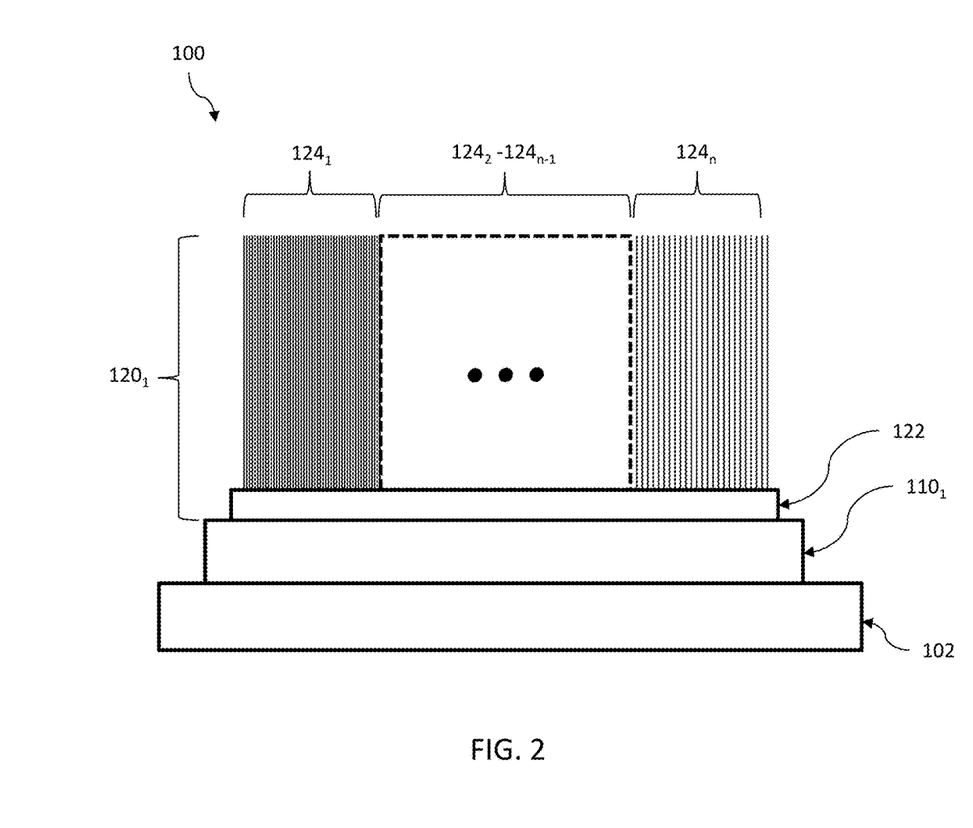
FIG. 2 is a cross-section view of the circuit card assembly of FIG. 1 through cutline 2-2.

However, unlike a traditional heat sink structure, the arrangement of the cooling members is configured to provide improved cooling for the processors $110_i$. Further, the arrangement of the cooling member also supports airflow in more than one direction. FIG. 2 shows a cross-section of the circuit card assembly 100 through cutline 2-2. As shown in FIG. 1, cutline 2-2 is directed through a first of the processors $110_1$ and the associated heat sink structure $120_1$.

As shown in FIG. 2, the heat sink structure $120_1$ can consist of a base 122 in thermal contact with the processor $110_1$. This can be implemented in a variety of ways. For example, in some particular embodiments, the base can be a highly thermal conductive metal or ceramic material attached to the processor $110_1$ using adhesives or one or more fasteners. However, any means for attaching a heat sink structure to a component to be cooled can be used in the various embodiments without limitation.

In the various embodiments, the cooling members can be configured to provide a series of zones $124_i$ (where i=1 ... n and n≥2) across the width of the heat sink structure $120_1$. More specifically, in the various embodiments, the cooling members in the each of the zones are configured and arranged so that in at least the first and second zones, there are different airflow impedances being provided. This can be accomplished by adjustment of the size, number, and/or spacing of the cooling members in the heat sink structure $120_1$ across the different zones. Thus, some zones $124_x$ can provide larger or smaller airflow impedance than other zones $124_y$. In this manner, air can pass quickly through certain portions of the heat sink structure $120_1$ and pass move slowly through others. For example, as schematically illustrated in FIG. 2, the density of cooling members in zone $124_1$ can be higher than the density of cooling members in zone $124_m$, thereby providing high airflow impedance and low airflow impedance zones, respectively.

As a result of the arrangement of the cooling members in the different zones, the air leaving the heat sink structure $120_1$ (and going on to the next heat sink structure) consists of air with portions at least at two different temperatures. A first portion consists of the air passing through the high airflow impedance portions (e.g., zone $124_1$). This air passes slowly through the heat sink structure $120_1$ and therefore absorbs a quantity of heat from the heat sink structure. Accordingly, this air leaves the heat sink structure $120_1$ at a first elevated temperature (relative to the air originally entering heat sink structure $120_1$). A second portion consists of the air passing through the low airflow impedance portions (e.g., zone $124_n$). This air passes quickly through the heat sink structure $120_1$ and also absorbs a quantity of heat from the heat sink structure $120_1$, but that quantity is less than the quantity of heat absorbed by the air passing through zone $124_1$. Accordingly, this air leaves the heat sink structure $120_1$ at a second elevated temperature (relative to the air originally entering heat sink structure $120_1$) lower than the first elevated temperature associated with air from the first zone $124_1$. The heat sink structures for other components in a shadow arrangement can be configured similarly, yet different, as discussed in greater detail below.

The resulting differences in temperature from the different zones can then be used advantageously to provide improved cooling down stream. Referring back to FIG. 1, airflow paths 130 and 132 are shown. As shown in FIG. 1, the airflow paths 130 and 132 proceed from a back end 102B to a front end 102A of the circuit card 102, substantially parallel to the longitudinal edges 102C and 102D. Assuming that the air provided along airflow paths 130 and 132 is initially at about a same temperature, the following is observed.

First, air along airflow path 130 is directed through a high airflow impedance zone $124_1$ of heat sink structure $120_1$. Concurrently, air along airflow path 132 is directed through a low airflow impedance zone $124_m$ of heat sink structure $120_1$. As discussed above, this results in air at point A (just downstream of the heat sink structure $120_1$ and along path 130) being at a higher temperature than air at point B (just downstream of the heat sink structure $120_1$ and along path 132). As a result, the air at point B will have a greater capacity for absorbing heat than the air at point A. This result can therefore be leveraged to cool downstream components.

For example, as shown in FIG. 1, heat sink structure $120_m$ can be designed by taking in consideration the temperature of the air at points A and B. That is, the heat sink structure $120_m$ can be configured to let the hotter air at point A pass through the heat sink structure $120_m$ more quickly than the cooler air at point B. This can be accomplished by configuring the zones $124_i$ in heat sink structure $120_m$ appropriately. In particular, the heat sink structure $120_m$ can be configured so that a low airflow impedance zone ($124_m$) is provided along airflow path 130, and a high airflow impedance zone is provided along airflow path 132. As a result, the heat sink structure $120_m$ effectively relies on the cooler air along airflow path 132 for cooling instead of the hotter air along airflow path 132. As a result of such an arrangement, more uniform cooling of the components $110_i$ can be achieved, since at least some of the air reaching heat sink structure $120_1$ is reserved for downstream cooling. As a result, at least some of the air reaching heat sink structure $120_m$ will still be at a lower temperature, and thus have a high capacity for absorbing heat.

Although the configuration shown in FIG. 1 is described with respect to a single high airflow impedance zone (e.g., $124_1$) in each of the heat sink structures $120_i$ and a single low airflow impedance zone (e.g., $124_m$) in each of the heat sink structures $120_i$, this is solely for ease of explanation. In the various embodiments, each heat sink structure $120_i$ can include any number of high airflow impedance zones and any number of low airflow impedance zones. In such configurations, the heat sink structure $120_1$ and $120_m$ would be configured so that if a zone in heat sink structure $120_1$ is a high airflow impedance zone, the downstream zone in heat sink structure $120_m$ would be a low airflow impedance zone. Similarly, if a zone in heat sink structure $120_1$ is a low airflow impedance zone, the downstream zone in heat sink structure $120_m$ would be a high airflow impedance zone.

Also, the configuration in FIG. 1 was discussed primarily with respect to two processors with heat sink structures in a shadow arrangement. However, the various embodiments are not limited in this regard. Rather, the techniques discussed herein can be applied to an arrangement of any number of processors with corresponding heat sink structures. In such an arrangement, the same methodology would apply. That is, zones of the various heat sink structures would be configured so that along any airflow path one would have one high airflow impedance zone for one of the heat sink structures and low airflow impedance for the corresponding zones in the other heat sink structures. This can be accomplished in a variety of ways. For example, in some configurations, the cooling members for the high airflow impedance zone can be configured with a first spacing, number, and/or size that provides a high airflow impedance and the cooling members for all of the low airflow impedance zones can be configured with a same second spacing, number, and/or size that provides a low airflow impedance.

Alternatively, a target airflow impedance of the high airflow impedance zone for each of the heat sink structures can be specified. Thus, the configuration of the cooling members in the zones along each airflow path can be configured to ensure the target airflow impedance is achieved. In some cases, it is contemplated that the arrangement of cooling members will vary across the multiple heat sink structures.

In some embodiments, the arrangement and configuration of the zones in each of the heat sink structures can also be selected to provide substantially the same cooling performance in multiple directions. For example, referring back to FIG. 1, airflow paths 130 and 132 are shown as being directed from the back end 102B to the front end 102A. However, the zones in the heat sink structures can also be arranged to provide substantially the same cooling for airflow being directed from the front end 102A to the back end 102B. In particular, as shown in FIG. 1, the zones in the same airflow path can be arranged symmetrically. That is, when viewed from the front end 102A or the back end 102B, the same arrangement of zones is observed.

For example, when viewing circuit car assembly 100 from the back end 102B, it appears as the following. First, a high impedance zone $124_1$ in heat sink structure $120_1$ is followed by a low impedance zone $124_m$ in heat sink structure $120_m$. Second, a low impedance zone $124_m$ in heat sink structure $120_1$ is followed by a high impedance zone $124_1$ in heat sink structure $120_m$. In turn, when viewing circuit car assembly 100 from the front end 102A, it appears as the following. First, a high impedance zone $124_1$ in heat sink structure $120_m$ is followed by a low impedance zone $124_m$ in heat sink structure $120_1$. Second, a low impedance zone $124_m$ in heat sink structure $120_m$ is followed by a high impedance zone $124_1$ in heat sink structure $120_1$. Thus, front end 102A or the back end 102B, the arrangement of zones is substantially the same. As a result, the air can travel in either direction across the card with substantially the same cooling results.

The discussion above is also based on the assumption that the components being cooled and associated heat sink structures are identical and perfectly aligned in a shadow arrangement. However, the various embodiments are also not limited in this regard. Rather the methods described herein can be applied to any arrangement of components that are partially overlapping (relative to the airflow). In such a configuration, the same arrangement for zones in overlapping portions can be as described above. In non-overlapping portions, the heat sink structures in can configured according to more traditional methods. Thus, a heat sink structure in such arrangements could contain three of more types of zones (low airflow impedance, high airflow impedance, and conventional airflow impedance).

Alternatively, in other to ensure a proper balance of airflow impedances for partially overlapping components, the heat sink structures can be overdesigned. That is, even though the components partially overlap, the associated heat sink structures can be extended so that at least the heat sink structures substantially overlap. In such a configuration, the zones can then be configured as described above.

It should also be noted that the configuration of FIG. 1 also shows that the depth (along the airflow path) of the components, and associated heat sink structures, is substantially the same. However, in the case of variations in depth, the configuration of the zones can vary. In particular, since an impedance of a zone will vary depending on the depth as well as the size, spacing, and arrangement of cooling members, zones in the heat sink structures intended to have a same airflow impedance may vary in size, spacing, and arrangement of the cooling members. Moreover, based on the cooling requirements for the components, the size, spacing, and arrangement of the cooling members in the different zones can also vary.

Examples

The examples shown here are not intended to limit the various embodiments. Rather they are presented solely for illustrative purposes.

To demonstrate the effectiveness of the configuration of the various embodiments, the thermal performance of a circuit card assembly configured in accordance with the various embodiments was simulated. This is shown below with respect to FIGS. 3, 4A, and 4B.

Figure 3:
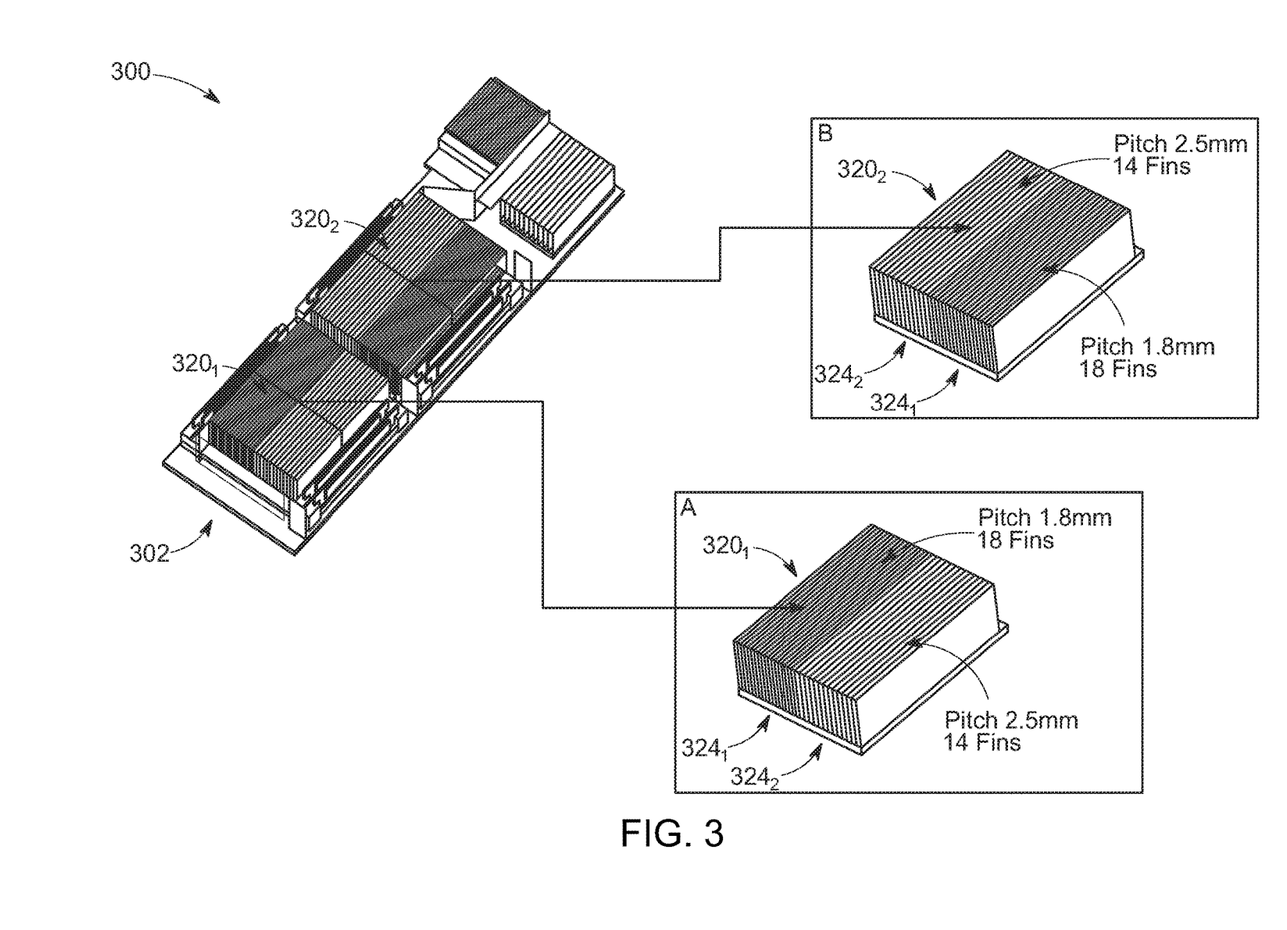
FIG. 3 shows a simulation model of a circuit card assembly according to the various embodiments.

FIG. 3 shows a model of a circuit card assembly 300 used for testing the heat sink architecture discussed above. In particular, the model depicts a circuit card assembly 300 for a PCIe general purpose GPU (GPGPU) add-on unit, in which two graphics processing units (GPUs) are used to perform calculations in a parallelized fashion. As shown in FIG. 3, the model shows two GPUs (covered by heat sink structures $320_1$ and $320_2$) disposed on a circuit card 302 of the circuit card assembly 300. The circuit card assembly 300 also includes additional components, as shown in FIG. 3.

For purposes of the simulation, the heat sink structures $320_1$ and $320_2$ were configured to each include two zones $324_1$ and $324_2$. The arrangement of each of the heat sink structures $320_1$ and $320_2$ is shown in insets A and B of FIG. 3, respectively. Zones $324_1$ and $324_2$ correspond to high airflow impedance and low airflow impedance zones, respectively. In particular, zone $342_1$ in each of heat sink structures $320_1$ and $320_2$ consist of 18 fins with a pitch of 1.8 mm. In contrast, zone $342_2$ in each of heat sink structures $320_1$ and $320_2$ consist of 14 fins with a pitch of 2.5 mm.

Figure 4A:
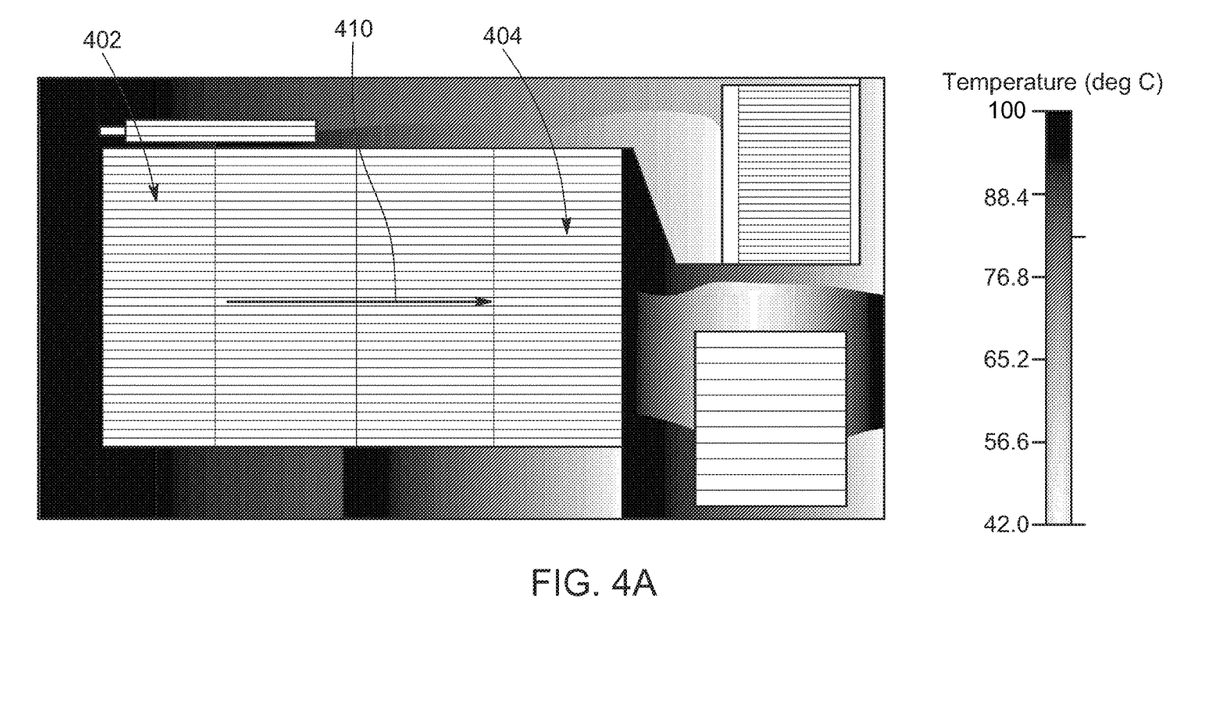
FIG. 4A shows simulation results for a circuit card assembly with conventional heat sink structures.
Figure 4B:
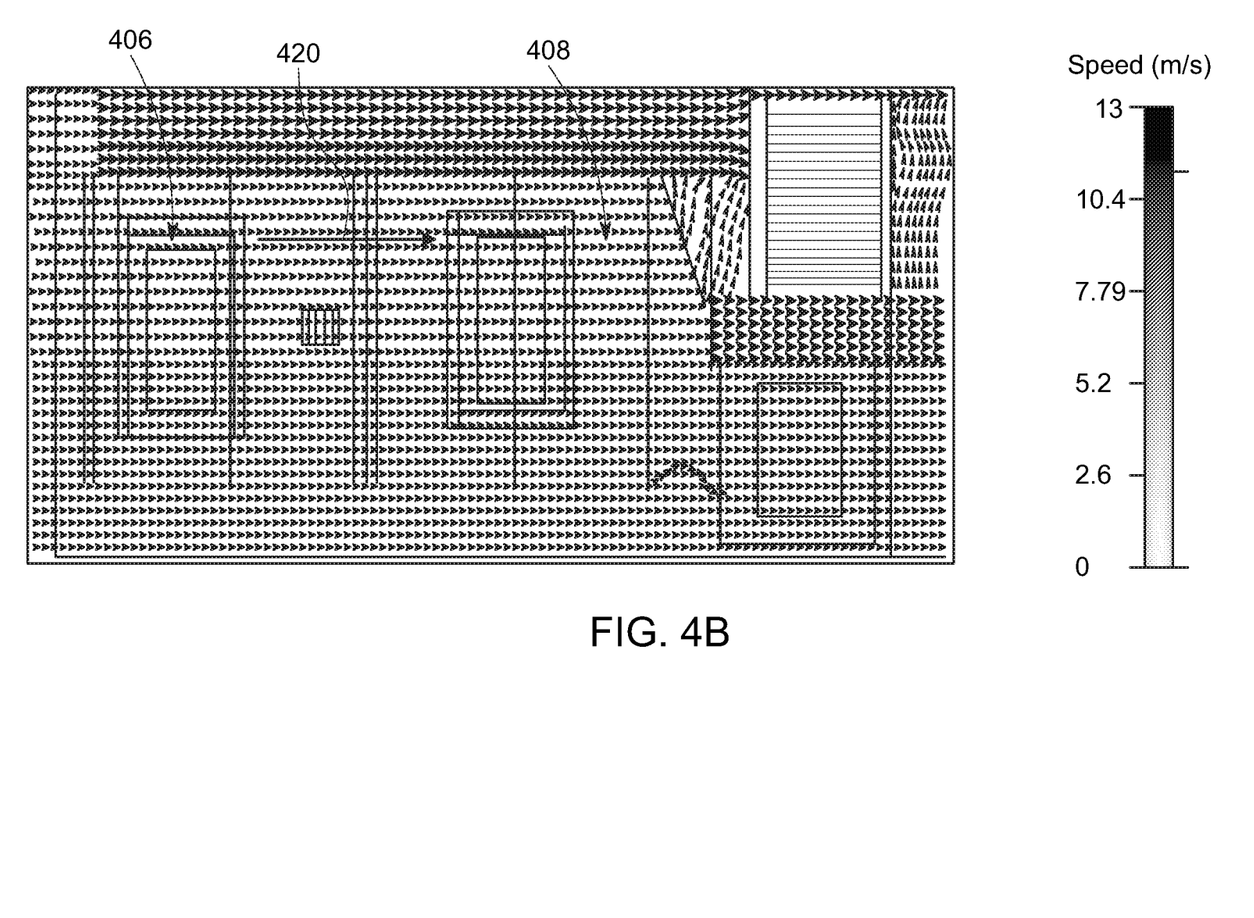
FIG. 4B shows simulation results for the circuit card assembly of FIG. 3.

The simulation results for this configuration are illustrated in FIGS. 4A and 4B. FIG. 4A shows the simulation results for a conventional circuit card assembly with a conventional arrangement of heat sink structures. FIG. 4A also indicates the direction of airflow (410). As shown in FIG. 4A, the region 402 associated with a first GPU/heat sink structure is associated with lower temperatures than a region 404 associated with a second GPU/heat sink structure. This is expected as in a traditional heat sink arrangement, the fresh air is substantially heated in the first region 402 and thus has less capacity to cool the second region 404.

FIG. 4B shows the simulation results for a circuit card assembly according to an embodiment, such as that shown in FIG. 3. FIG. 4B also indicates the direction of airflow (420). As shown in FIG. 4B, the region 406 associated with a first processor/heat sink structure is associated with similar temperatures than a region 408 associated with a second processor/heat sink structure. As noted above, this is a result of using the different zone configurations to provide at least some cooler air into region 408, albeit at the cost of a slight elevation in temperature in region 406. However, the simulation results show that despite the elevation in region 406, the temperatures across circuit card assembly 300 are more uniform and avoid overheating of critical components, such as the GPUs.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an", and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A circuit card assembly, comprising:
   a circuit card;

a plurality of components disposed on a first surface of the circuit card, the plurality of components arranged in a path substantially perpendicular to an airflow path along the first surface of the circuit card;

a plurality of air-cooled heat sink structures, each disposed on one of the plurality of components;

wherein each of the plurality of heat sink structures comprises a plurality of impedance zones arranged in series substantially perpendicular to the airflow path, wherein the plurality of impedance zones comprise a first impedance zone having a first air impedance, and a second impedance zone having a second air impedance less than the first air impedance, and wherein the plurality of zones in the plurality of heat sink structures are aligned so that the first impedance zone in one of the plurality of heat sink structures does not overlap with the first impedance zone in another of the plurality of heat sink structures, relative to the airflow path.

2. The circuit card assembly of claim 1, wherein each of the plurality of heat sink structures comprises a plurality of fins.

3. The circuit card assembly of claim 2, wherein a spacing of a portion of the plurality of fins in the first impedance zone is less than a spacing of a portion of the plurality of fins in the second impedance zone.

4. The circuit card assembly of claim 1, wherein the plurality of zones in the plurality of heat sink structures are aligned so that airflow through the first impedance zone in each one of the plurality of heat sink structures is substantially equal in a first direction along the airflow path.

5. The circuit card assembly of claim 4, wherein the plurality of zones in the plurality of heat sink structures are aligned so that airflow through the first impedance zone in each one of the plurality of heat sink structures in a second direction opposite the first direction, is substantially equal to the airflow in the first direction.

6. The circuit card assembly of claim 1, wherein the plurality of heat sink structures have substantially the same width in a direction perpendicular to the airflow path.

7. The circuit card assembly of claim 1, wherein the plurality of heat sink structures substantially overlap each other relative to the airflow path.

8. An add-on processing unit, comprising:
a circuit card;
a first processor and a second processor disposed in series on a first surface of the circuit card along an airflow path;
a first heat sink structure disposed on the first processor; and
a second heat sink structure disposed on the second processor;
wherein each of the first heat sink structure and the second heat sink structure comprises at least a first impedance zone, and a second impedance zone arranged in series substantially perpendicular to the airflow path,
wherein the first impedance zone has a first air impedance, and the second impedance zone has a second air impedance less than the first air impedance; and
wherein the first impedance zone in the first heat sink structure does not overlap with the first impedance zone in the second heat sink structure, relative to the airflow path.

9. The processing unit of claim 8, wherein each of the first heat sink structure and the second heat sink structure comprises a plurality of fins.

10. The processing unit of claim 9, wherein a spacing of a portion of the plurality of fins in the first impedance zone is less than a spacing of a portion of the plurality of fins in the second impedance zone.

11. The processing unit of claim 8, wherein airflow through the first impedance zone in each one of the plurality of heat sink structures is substantially equal in a first direction along the airflow path.

12. The processing unit of claim 11, wherein the plurality of zones in the first and the second heat sink structures are aligned so that airflow through the first impedance zone in each one of the first and the second heat sink structures, in a second direction opposite the first direction, is substantially equal to the airflow in the first direction.

13. The processing unit of claim 8, wherein the first heat sink structure and the second heat sink structure have substantially the same width in a direction perpendicular to the airflow path.

14. The processing unit of claim 8, wherein the first heat sink structure and the second heat sink structure substantially overlap each other relative to the airflow path.

* * * * *